United States Patent
Joo et al.

(10) Patent No.: US 8,797,817 B2
(45) Date of Patent: Aug. 5, 2014

(54) SEMICONDUCTOR DEVICES, OPERATING METHODS THEREOF, AND MEMORY SYSTEMS INCLUDING THE SAME

(75) Inventors: Jong Doo Joo, Seongnam-si (KR); Cheol Ha Lee, Suwon-si (KR); Jung-Han Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 337 days.

(21) Appl. No.: 13/238,463

(22) Filed: Sep. 21, 2011

(65) Prior Publication Data

US 2012/0081986 A1 Apr. 5, 2012

(30) Foreign Application Priority Data

Oct. 1, 2010 (KR) ........................ 10-2010-0095705

(51) Int. Cl.
*G11C 7/02* (2006.01)

(52) U.S. Cl.
USPC .... 365/207; 365/149; 365/154; 365/189.011; 365/202; 365/205

(58) Field of Classification Search
USPC .......... 365/207, 208, 149, 154, 189.011, 202, 365/204, 205
See application file for complete search history.

(56) References Cited

U.S. PATENT DOCUMENTS

| 5,291,447 A | | 3/1994 | Kodama et al. | |
|---|---|---|---|---|
| 5,677,886 A | * | 10/1997 | Seo et al. | 365/203 |
| 5,768,204 A | * | 6/1998 | Muraoka | 365/149 |
| 6,205,068 B1 | * | 3/2001 | Yoon | 365/203 |
| 2005/0135137 A1 | * | 6/2005 | Lee et al. | 365/69 |
| 2007/0278554 A1 | * | 12/2007 | Song et al. | 257/314 |

FOREIGN PATENT DOCUMENTS

| JP | 10-269774 A | 10/1998 |
|---|---|---|
| KR | 20000009375 A | 2/2000 |
| KR | 20020025501 A | 4/2002 |

* cited by examiner

*Primary Examiner* — Toan Le
(74) *Attorney, Agent, or Firm* — Harness, Dickey & Pierce, P.L.C.

(57) ABSTRACT

At least one example embodiment discloses a semiconductor device. The semiconductor device includes a first sense amplifier selectively connected between a first bit line and a second bit line, a second sense amplifier selectively connected between the first bit line and the second bit line, a first power supply circuit configured to provide a power supply voltage to the first sense amplifier in response to a first control signal, a second power supply circuit configured to provide a ground voltage to the second sense amplifier in response to a second control signal, and a switching circuit configured to selectively connect the first power supply circuit with the second power supply circuit in response to a third control signal.

15 Claims, 14 Drawing Sheets

SEMICONDUCTOR DEVICES, OPERATING METHODS THEREOF, AND MEMORY SYSTEMS INCLUDING THE SAME

CROSS-REFERENCE TO RELATED APPLICATIONS

This application claims priority under 35 U.S.C. §119(a) to Korean Patent Application No. 10-2010-0095705 filed on Oct. 1, 2010, the entire contents of which are hereby incorporated by reference.

BACKGROUND

At least one example embodiment relates to a semiconductor device, and more particularly, to a semiconductor device capable of writing data to a memory cell at a high rate, an operating method thereof, and/or a memory system including the same.

In semiconductor devices, for example, dynamic random access memory (DRAM) devices, a sense amplifier amplifies the voltage difference between a pair of bit lines when data is read from or written to a memory cell. Since the sense amplifier continuously amplifies the voltage difference between the bit lines during the write operation, it tends to maintain the voltage difference.

SUMMARY

At least some example embodiments provide a semiconductor device for increasing the writing speed of an input/output (I/O) driver by reducing the driving intensity of a sense amplifier during a write operation, an operating method thereof, and/or a memory system including the same.

According to at least some example embodiments, there is provided a semiconductor device including a first sense amplifier selectively connected between a first bit line and a second bit line, a second sense amplifier selectively connected between the first bit line and the second bit line, a first power supply circuit configured to provide a power supply voltage to the first sense amplifier in response to a first control signal, a second power supply circuit configured to provide a ground voltage to the second sense amplifier in response to a second control signal, and a switching circuit configured to selectively connect the first power supply circuit and the second power supply circuit in response to a third control signal.

The semiconductor device may further include a control signal generation circuit configured to generate the first control signal and the third control signal, the first control signal and the third control signal are complementary to each other during a data flip period.

During a data flip period, the switching circuit may be activated in response to the third control signal if the first power supply circuit is deactivated in response to the first control signal the switching circuit being configured to connect the first power supply circuit and the second power supply circuit if activated.

The switching circuit includes a transistor, and a voltage of a node of the first sense amplifier is higher than a voltage of a node of the second sense amplifier by a threshold voltage of the transistor during the data flip period, the node of the first sense amplifier is configured to receive the power supply voltage, and the node of the second sense amplifier is configured to receive the ground voltage.

The first control signal and the third control signal are complementary to each other while a column selection signal is in an activated state during a write operation. The column selection signal may control operations of a plurality of switches which connect the first bit line and the second bit line to an input/output line and a complementary input/output line, respectively.

According to at least other example embodiments, there is provided an operating method of a semiconductor device. The operating method includes selectively providing a power supply voltage to a first sense amplifier connected between a first bit line and a second bit line using a first power supply circuit which operates in response to a first control signal, selectively providing a ground voltage to a second sense amplifier selectively connected between the first bit line and the second bit line using a second power supply circuit which operates in response to a second control signal, and controlling a connection between the first power supply circuit and the second power supply circuit using a switching circuit which operates in response to a third control signal.

The operating method may further include generating the first control signal and the third control signal during a data flip period, the first control signal and the third control signal being complementary to each other.

The switching circuit includes a transistor, and a voltage of a node of the first sense amplifier may be higher than a voltage of a node of the N-type sense amplifier by a threshold voltage of the transistor during the data flip period, the node of the first sense amplifier is configured to receive the power supply voltage, and the node of the N-type sense amplifier is configured to receive the ground voltage.

According to at least further example embodiments, there is provided a memory module including the above-described semiconductor device and a semiconductor substrate, the semiconductor device being on the semiconductor substrate.

The semiconductor device may further include a control signal generation circuit configured to generate the first control signal and the third control signal, which are complementary to each other during a data flip period.

In at least other example embodiments, a memory system includes the above-described memory module and a main board including a slot which is configured to receive the memory module, and a processor configured to control an operation of the semiconductor device.

In yet at least other example embodiments, a memory system includes the above-described semiconductor device and a memory controller configured to control an operation of the semiconductor device.

During a data flip period, the switching circuit may be activated in response to the third control signal if the first power supply circuit is deactivated in response to the first control signal.

At least another example embodiment discloses a semiconductor device including a control signal generation circuit configured to generate at least one control signal, and at least one sense amplifier including first and second power supply circuits and a switching circuit, the switching circuit configured to selectively connect the first and second power supply circuits based on the at least one control signal.

BRIEF DESCRIPTION OF THE DRAWINGS

The above and other features and advantages of example embodiments will become more apparent by describing in detail example embodiments thereof with reference to the attached drawings in which.

DETAILED DESCRIPTION OF EXAMPLE EMBODIMENTS

Figure 1:
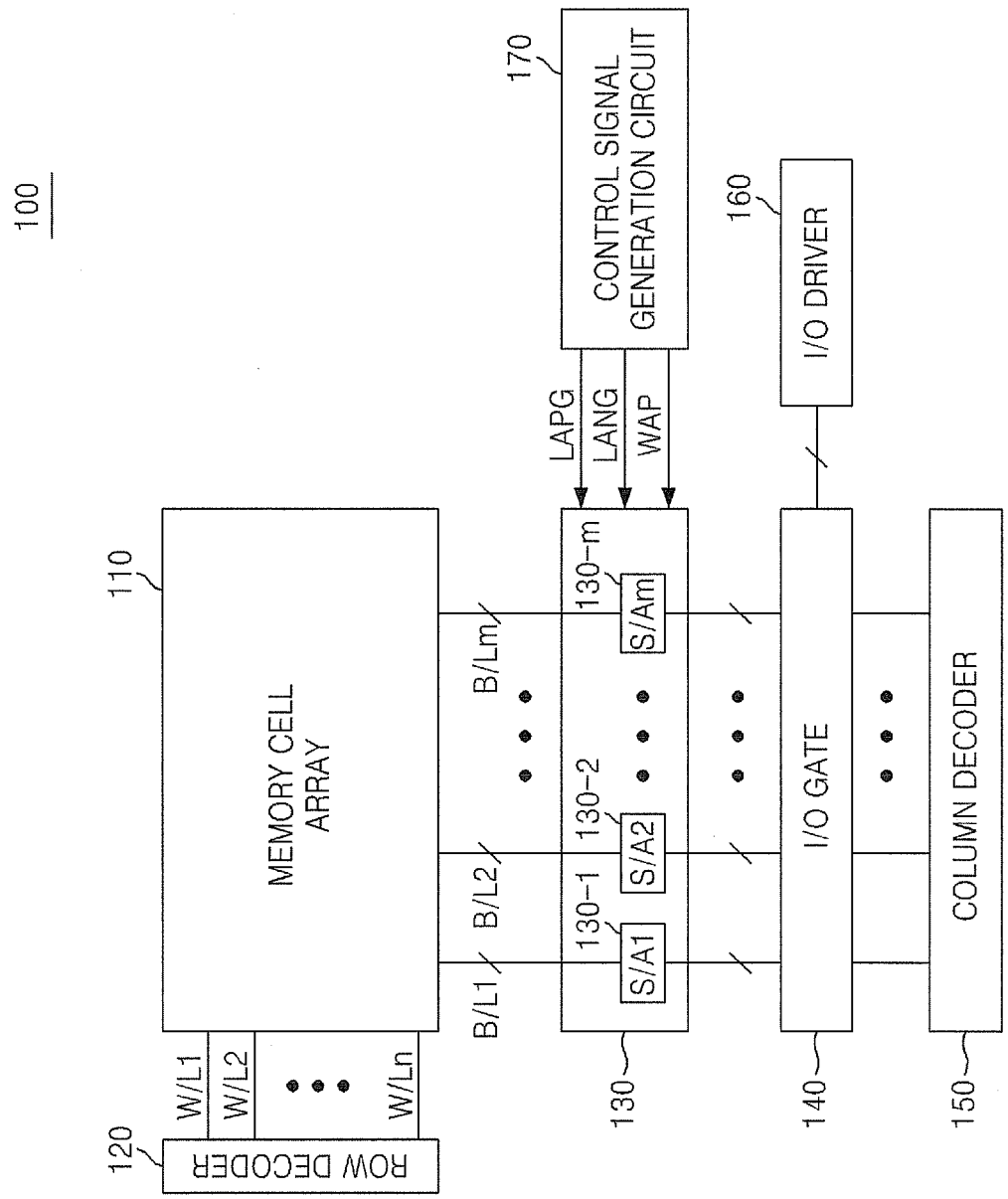
FIG. 1 is a block diagram of a semiconductor device according to at least some example embodiments.

Example embodiments now will be described more fully hereinafter with reference to the accompanying drawings, in which example embodiments are shown. Example embodiments may, however, be embodied in many different forms and should not be construed as limited to the embodiments set forth herein. Rather, these example embodiments are provided so that this disclosure will be thorough and complete, and will fully convey the scope of example embodiments to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a semiconductor device 100 according to at least some example embodiments. The semiconductor device 100 includes a memory cell array 110, a row decoder 120, a sense amplifier block 130, an input/output (I/O) gate 140, a column decoder 150, an I/O driver 160, and a control signal generation circuit 170.

The memory cell array 110 includes a plurality of word lines W/L1 through W/Ln, a plurality of bit lines B/L1 through B/Lm, and a plurality of memory cells storing data, where "n" and "m" are natural numbers. Each of the bit lines B/L1 through B/Lm includes a bit line and a complementary bit line. The row decoder 120 decodes a row address and selects one word line from among the word lines W/L1 through W/Ln according to the decoding result.

The sense amplifier block 130 includes a plurality of sense amplifiers 130-1 through 130-m, each of which senses and amplifies a voltage change in a corresponding one of the bit lines B/L1 through B/Lm. The sense amplifier block 130 may also include a plurality of write drivers (not shown) that transmit write data to the bit lines B/L1 through B/Lm, respectively. The sense amplifiers 130-1 through 130-m sense and amplify a voltage difference in the bit lines B/L1 through B/Lm, respectively, in response to a plurality of control signals LAPG, LANG, and WAP output from the control signal generation circuit 170.

The column decoder 150 decodes a column address and generates a plurality of column selection signals according to the decoding result. The I/O gate 140 connects the sense amplifier block 130 with the I/O driver 160 in response to the column selection signals output from the column decoder 150.

During a write operation, the I/O gate 140 transmits write data output from the I/O driver 160 to the sense amplifier block 130 in response to the column selection signals output from the column decoder 150. During a read operation, the I/O gate 140 transmits signals, which have been sensed and amplified by the sense amplifier block 130, to the I/O driver 160 in response to the column selection signals output from the column decoder 150.

While the semiconductor device 100 performs the read or write operation, the control signal generation circuit 170 generates the control signals LAPG, LANG, and WAP for controlling the operation of the sense amplifiers 130-1 through 130-*m* included in the sense amplifier block 130.

Figure 2:
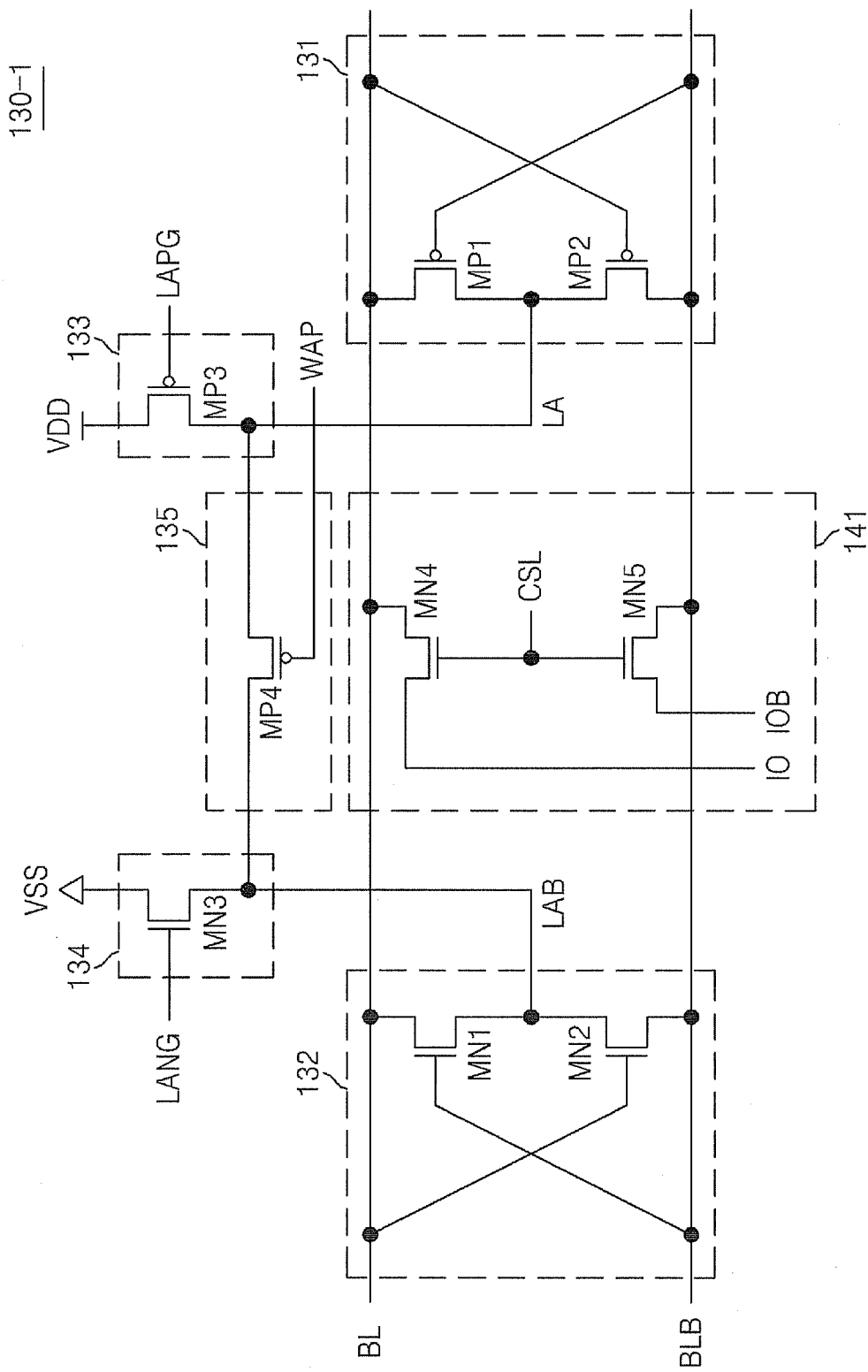
FIG. 2 is a partial circuit diagram of a sense amplifier and an input/output (I/O) gate illustrated in FIG. 1 according to at least one example embodiment.

FIG. 2 is a partial circuit diagram of the sense amplifier 130-1 and the I/O gate 140 illustrated in FIG. 1. For clarity of the description, only one sense amplifier 130-1 among the sense amplifiers 130-1 through 130-*m* and a part of the I/O gate (hereinafter, referred to as a partial I/O gate 141) are illustrated in FIG. 2. Referring to FIG. 2, the sense amplifier 130-1 includes a P-type sense amplifier (first sense amplifier) 131, an N-type sense amplifier (second sense amplifier) 132, a first power supply circuit 133, a second power supply circuit 134, and a switching circuit 135.

The P-type sense amplifier 131 senses and amplifies a voltage difference between a bit line (first bit line) BL and a complementary bit line (second bit line) BLB. The P-type sense amplifier 131 includes a plurality of P-type metal-oxide-semiconductor (PMOS) transistors MP1 and MP2 connected in series between the bit line BL and the complementary bit line BLB. A gate of the transistor MP1 connected to the bit line BL is connected to the complementary bit line BLB and a gate of the transistor MP2 connected to the complementary bit line BLB is connected to the bit line BL.

The N-type sense amplifier 132 senses and amplifies the voltage difference between the bit line BL and the complementary bit line BLB. The N-type sense amplifier 132 includes a plurality of N-type metal-oxide-semiconductor (NMOS) transistors MN1 and MN2 connected in series between the bit line BL and the complementary bit line BLB. A gate of the transistor MN1 connected to the bit line BL is connected to the complementary bit line BLB and a gate of the transistor MN2 connected to the complementary bit line BLB is connected to the bit line BL.

The first power supply circuit 133 provides a power supply voltage VDD to the P-type sense amplifier 131 in response to the first control signal LAPG. The first power supply circuit 133 may be implemented by a PMOS transistor MP3 and is connected between a line for providing the power supply voltage VDD and a common node LA of the P-type sense amplifier 131.

The second power supply circuit 134 provides a ground voltage VSS to the N-type sense amplifier 132 in response to the second control signal LANG. The second power supply circuit 134 may be implemented by an NMOS transistor MN3 and is connected between a line for providing the ground voltage VSS and a common node LAB of the N-type sense amplifier 132.

The switching circuit 135 controls the connection between the first power supply circuit 133 and the second power supply circuit 134 in response to the third control signal WAP. The switching circuit 135 may be implemented by a transistor, for example, a PMOS transistor MP4 and is connected between an output terminal of the first power supply circuit 133 and an output terminal of the second power supply circuit 134.

The partial I/O gate 141 outputs the signals of the respective bit lines BL and BLB to a pair of I/O lines IO and IOB, respectively, in response to a column selection signal CSL.

Figure 3:
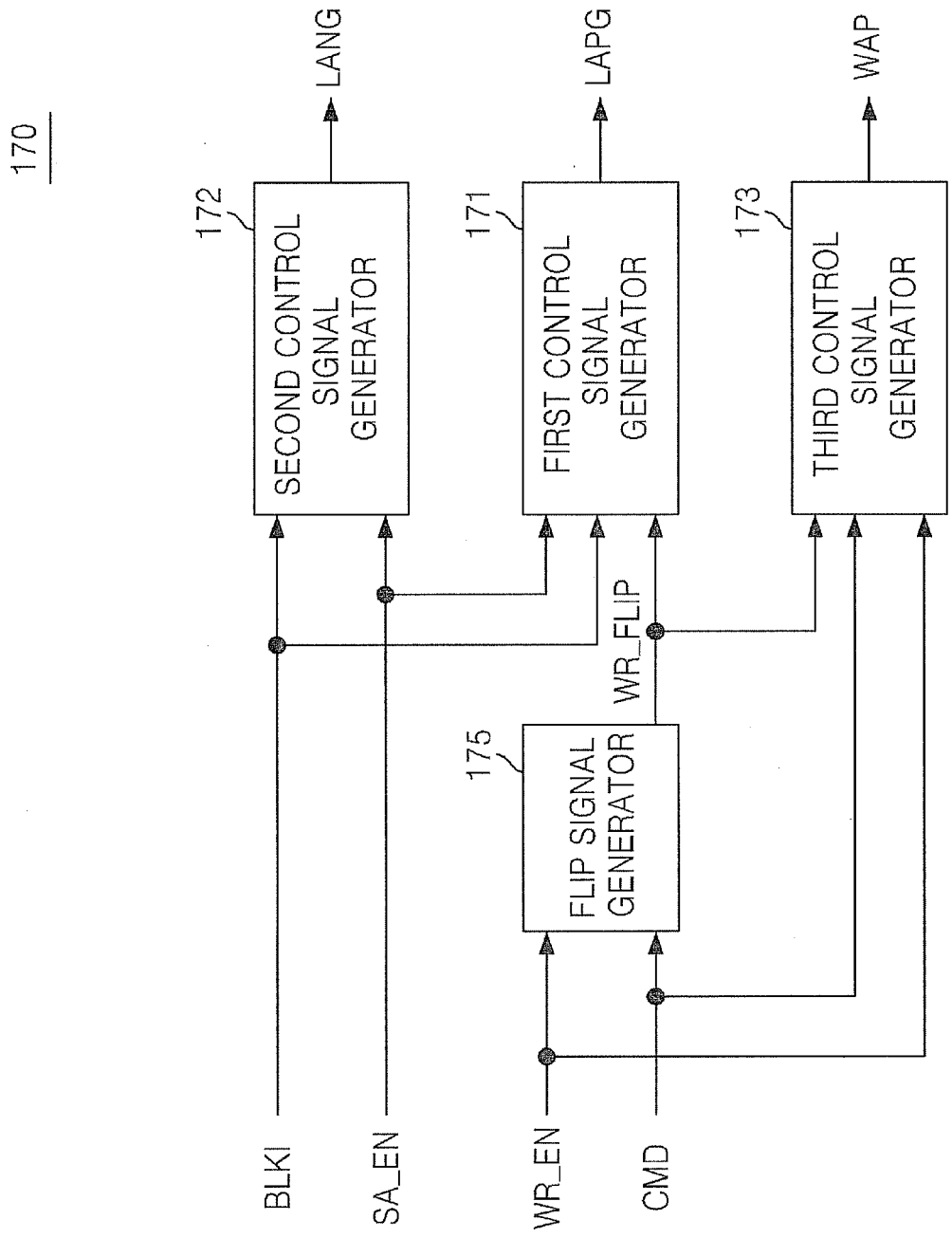
FIG. 3 is a block diagram of a control signal generation circuit illustrated in FIG. 1 according to at least one example embodiment.

FIG. 3 is a block diagram of the control signal generation circuit 170 illustrated in FIG. 1. Referring to FIGS. 1 through 3, the control signal generation circuit 170 includes a first control signal generator 171, a second control signal generator 172, a third control signal generator 173, and a flip signal generator 175.

The first control signal generator 171 generates the first control signal LAPG according to a sense amplifier enable signal SA_EN, block information BLKI, and a write flip signal WR_FLIP. The sense amplifier enable signal SA_EN is activated after an externally input active command is activated. The block information BLKI indicates an address of a memory block of a plurality of memory cells connected to a plurality of sense amplifiers in the memory cell array 110. Accordingly, the first control signal generator 171 generates the first control signal LAPG that is activated during a data flip period while the signal of each of the bit lines BL and BLB is changed or flipped in a write operation.

The second control signal generator 172 generates the second control signal LANG according to the sense amplifier enable signal SA_EN and the block information BLKI. The third control signal generator 173 generates the third control signal WAP during the data flip period to reduce the driving intensity of the P-type sense amplifier 131.

The third control signal generator 173 may generate the third control signal WAP according to a write enable signal WR_EN generated based on a write command, command execution mode information CMD, and a write flip signal WR_FLIP. The command execution mode information CMD may be information indicating that a read or write command is being executed. The write enable signal WR_EN and the command execution mode information CMD may be synchronized with a clock signal.

Figure 8:
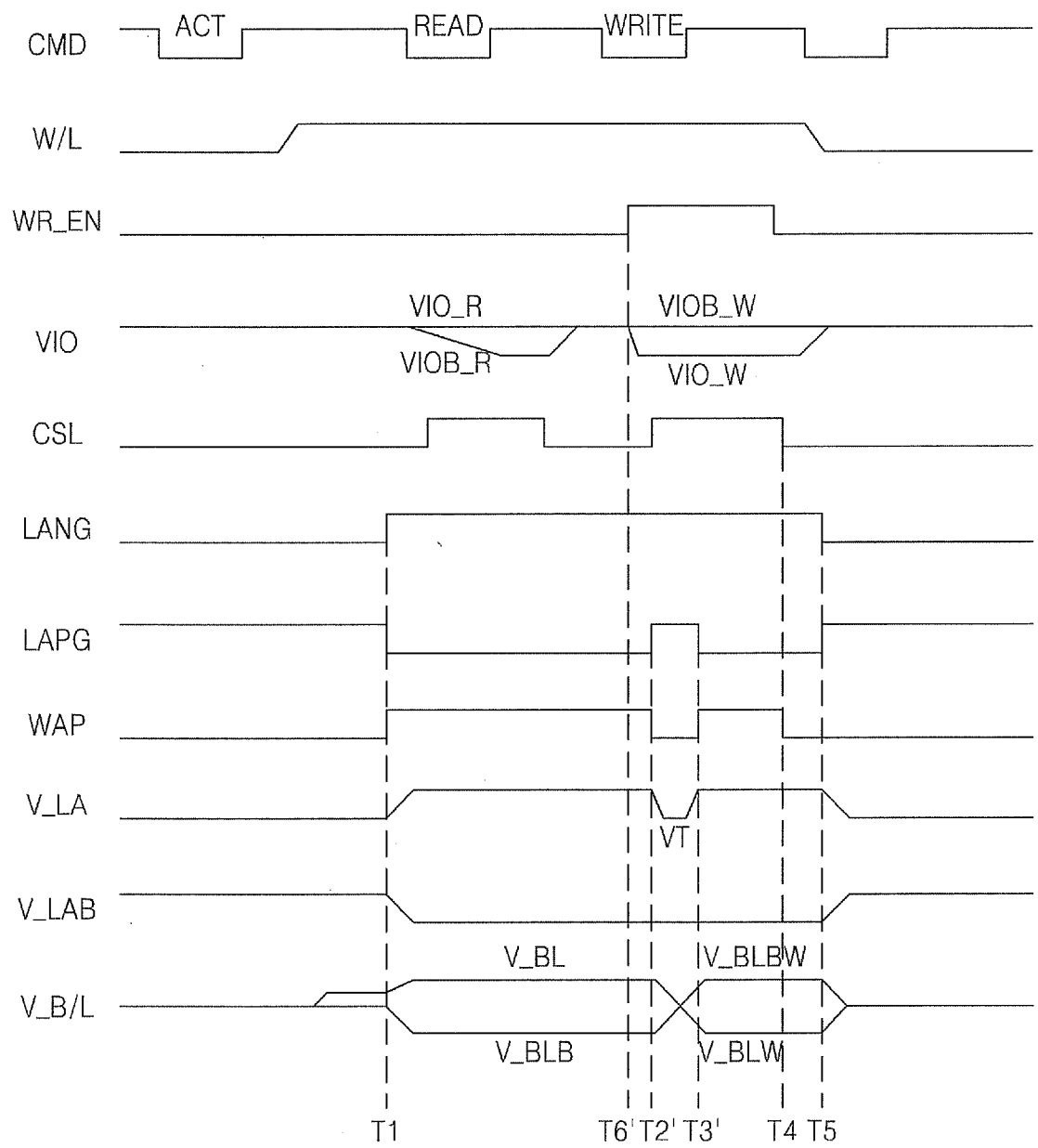
FIG. 8 is a timing chart showing the operation of the semiconductor device illustrated in FIG. 1 according to at least one example embodiment.

In response to the write enable signal WR_EN and the command execution mode information CMD, the flip signal generator 175 generates the write flip signal WR_FLIP for defining the activation period of the first control signal LAPG and the deactivation period of the third control signal WAP during the data flip period (from T2' to T3' in FIG. 8).

Figure 4:
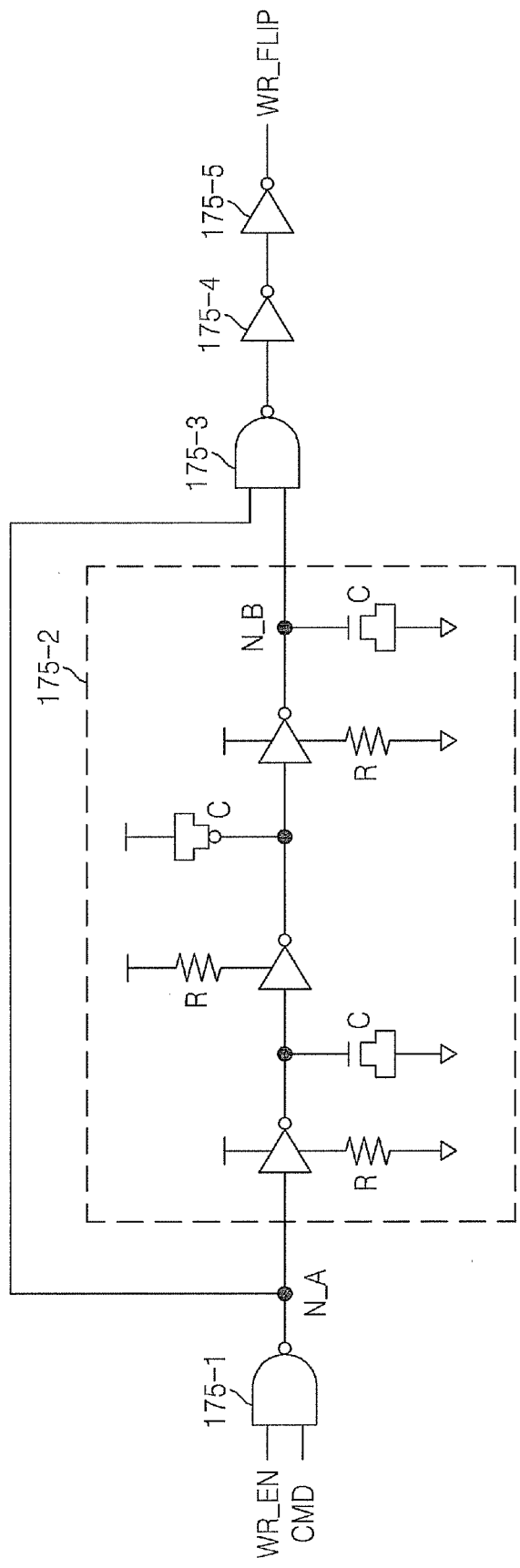
FIG. 4 is a circuit diagram of a flip signal generator illustrated in FIG. 3 according to at least one example embodiment.
Figure 5:
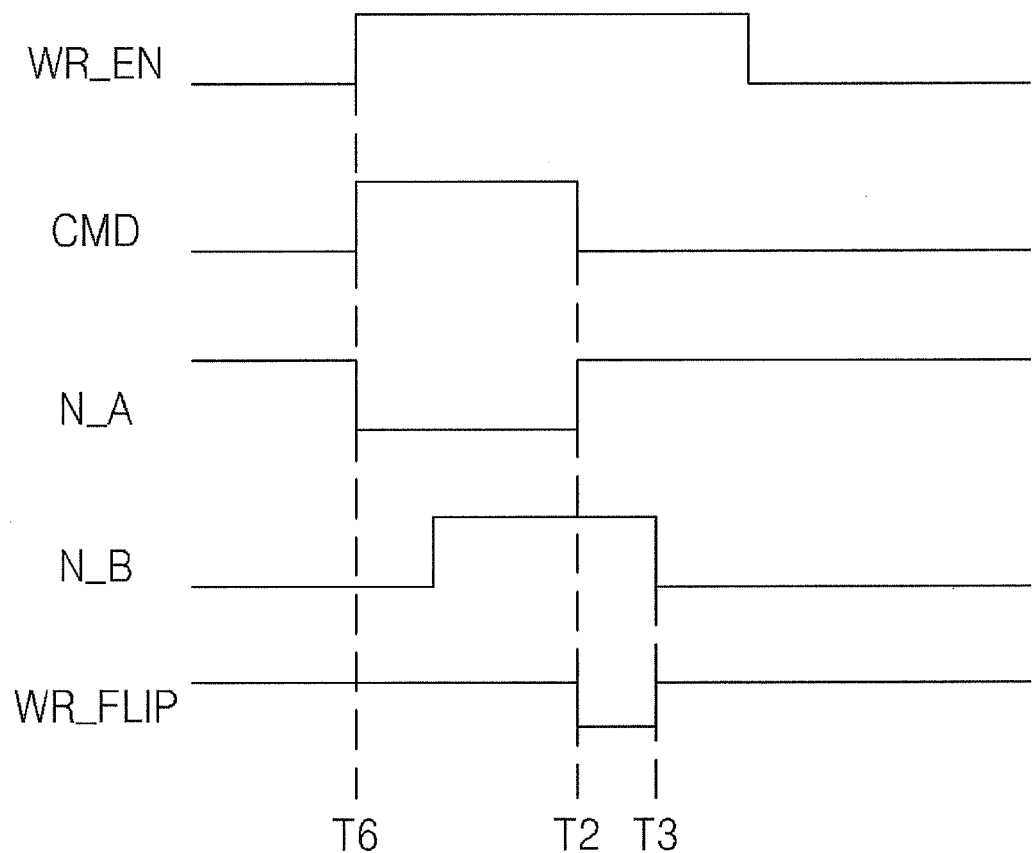
FIG. 5 is a timing chart showing the operation of the flip signal generator illustrated in FIG. 4 according to at least one example embodiment.

FIG. 4 is a circuit diagram of the flip signal generator 175 illustrated in FIG. 3. FIG. 5 is a timing chart showing the operation of the flip signal generator 175 illustrated in FIG. 4. The flip signal generator 175 includes a first NAND gate 175-1, a delay circuit 175-2, a second NAND gate 175-3, a first inverter 175-4, and a second inverter 175-5.

Referring to FIGS. 4 and 5, the first NAND gate 175-1 performs a NAND operation on the write enable signal WR_EN and the command execution mode information CMD. As illustrated in FIG. 5, an output signal N_A of the first NAND gate 175-1 is deactivated, for example, at a low level from a time point T6 to a time point T2. The delay circuit 175-2 delays the output signal N_A of the first NAND gate 175-1 using a plurality of inverters, a plurality of resistors R, and a plurality of capacitors C.

The second NAND gate 175-3 performs a NAND operation on the output signal N_A of the first NAND gate 175-1 and an output signal N_B of the delay circuit 175-2. The first inverter 175-4 inverts an output signal of the second NAND gate 175-3. The second inverter 175-5 inverts an output signal of the first inverter 175-4 to generate the write flip signal WR_FLIP. As illustrated in FIG. 5, the write flip signal WR_FLIP is deactivated, for example, at a low level from the time point T2 to a time point T3. For clarity of the description, signal delay by each of the elements 175-1 through 175-5 is not considered in the timing chart illustrated in FIG. 5.

Figure 6:
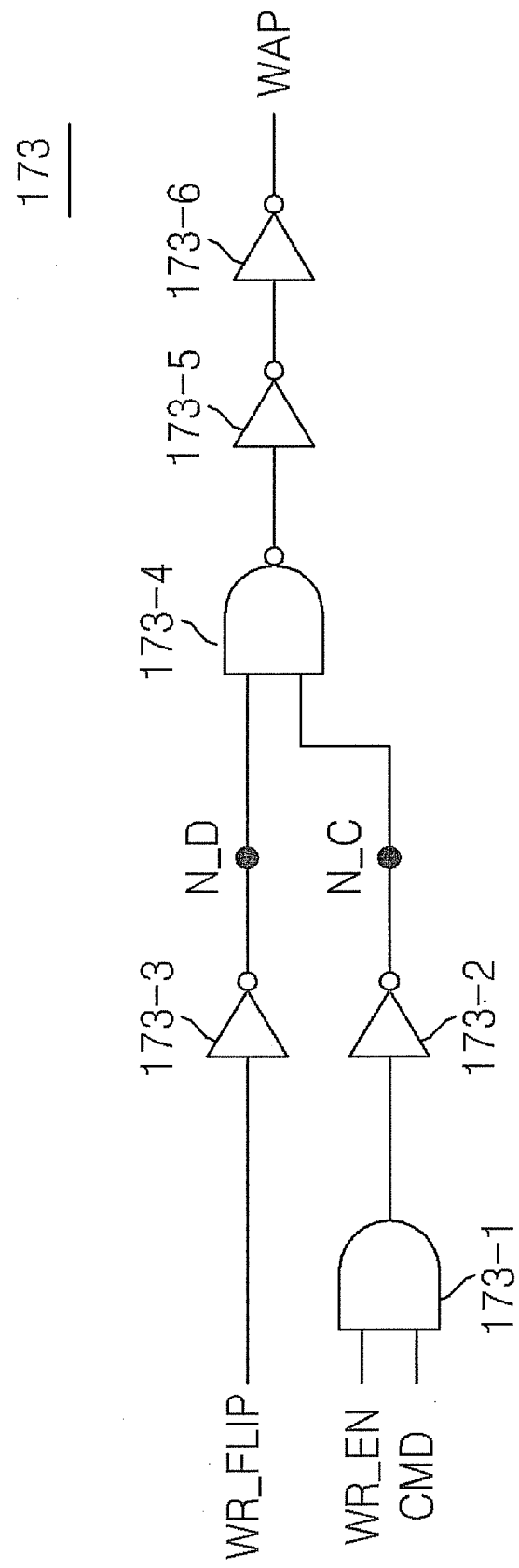
FIG. 6 is a circuit diagram of a third control signal generator illustrated in FIG. 3 according to at least one example embodiment.
Figure 7:
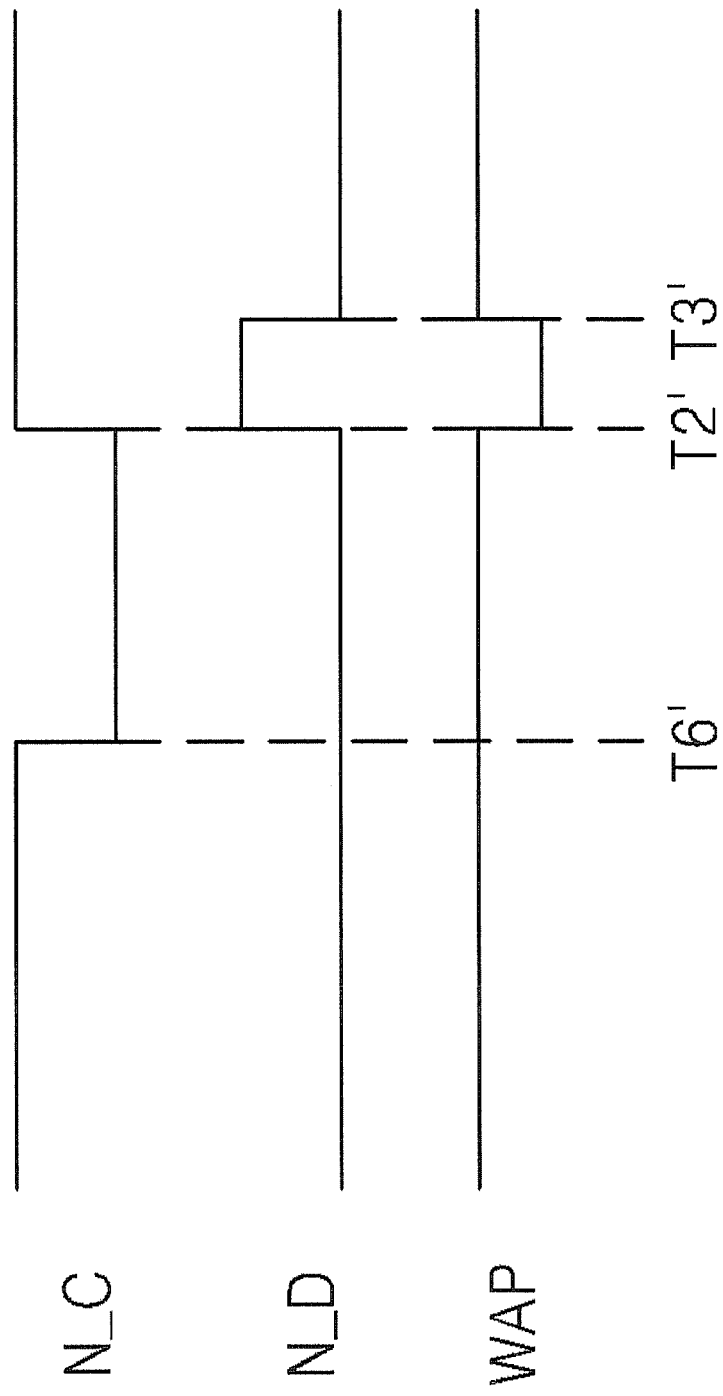
FIG. 7 is a timing chart showing the operation of the third control signal generator illustrated in FIG. 6 according to at least one example embodiment.

FIG. 6 is a circuit diagram of the third control signal generator 173 illustrated in FIG. 3. FIG. 7 is a timing chart showing the operation of the third control signal generator 173 illustrated in FIG. 6. Referring to FIGS. 3, 6, and 7, the third control signal generator 173 includes an AND gate 173-1, a third inverter 173-2, a fourth inverter 173-3, a third NAND gate 173-4, a fifth inverter 173-5, and a sixth inverter 173-6.

The AND gate 173-1 performs an AND operation on the write enable signal WR_EN and the command execution mode information CMD. An output signal of the AND gate 173-1 is inverted by the third inverter 173-2. An output signal N_C of the third inverter 173-2 is deactivated from a time point T6' to a time point T2'. The time points T6' and T2' lag behind the time points T6 and T2, respectively. The write flip signal WR_FLIP is inverted by the fourth inverter 173-3. An output signal N_D of the fourth inverter 173-3 is activated, for example, at a high level from the time point T2' to a time point T3'. The time point T3' lags behind the time point T3.

The third NAND gate 173-4 performs a NAND operation on the output signal N_C of the third inverter 173-2 and the output signal N_D of the fourth inverter 173-3. The fifth inverter 173-5 inverts an output signal of the third NAND gate 173-4. The sixth inverter 173-6 inverts an output signal of the fifth inverter 173-5 to generate the third control signal WAP. The third control signal WAP is deactivated from time point T2' to the time point T3'.

FIG. 8 is a timing chart showing the operation of the semiconductor device 100 illustrated in FIG. 1. Referring to FIGS. 1 through 8, when an active command ACT is input to the semiconductor device 100, a word line signal W/L is activated. When a read command READ is input for a read operation, at a time point T1 the write enable signal WR_EN is maintained deactivated, the first control signal LAPG is deactivated, and the second control signal LANG and the third control signal WAP are activated.

Accordingly, the first power supply circuit 133 provides the power supply voltage VDD to the P-type sense amplifier 131 through the common node LA in response to the first control signal LAPG in the deactivated state. At this time, the second power supply circuit 134 provides the ground voltage VSS to the N-type sense amplifier 132 through the common node LAB in response to the second control signal LANG in the activated state. In addition, the switching circuit 135 cuts off the connection between the first power supply circuit 133 and the second power supply circuit 134 in response to the third control signal WAP in the activated state. The common node LA of the P-type sense amplifier 131 has a voltage V_LA and the common node LAB of the N-type sense amplifier 132 has a voltage V_LAB.

When a voltage V_BL of the bit line BL is at a high level (e.g., data 1) and a voltage V_BLB of the complementary bit line BLB is at a low level (e.g., data 0) during the read operation, the transistor MP1 of the P-type sense amplifier 131 is turned on, developing the voltage V_BL of the bit line BL to the power supply voltage VDD, and the transistor MN2 of the N-type sense amplifier 132 is turned on, developing the voltage V_BLB of the complementary bit line BLB to the ground voltage VSS. Accordingly, after a sensing operation is completed in the read operation, the voltage V_BL of the bit line BL remains at the high level (e.g., data 1) and the voltage V_BLB of the complementary bit line BLB remains at the low level (e.g., data 0).

Thereafter, when the column selection signal CSL is activated, the voltage V_BL of the bit line BL is output at the high level through the I/O line IO and the voltage V_BLB of the complementary bit line BLB is output at the low level through the complementary I/O line IOB. In other words, a voltage VIO_R of the I/O line IO is at high level and a voltage VIOB_R of the complementary I/O line IOB is at a low level.

When data 0 is to be provided to the bit line BL and data 1 is provided to the complementary bit line BLB during a write operation, that is, when a voltage VIO_W of the I/O line IO that may be connected to the bit line BL is at a low level and a voltage VIOB_W of the complementary I/O line IOB that may be connected to the complementary bit line BLB is at a high level, the sense amplifier 130-1 operates as follows.

The write enable signal WR_EN is activated at the time point T6' in response to a write command WRITE. At this time, the voltage V_BL of the bit line BL remains at the high level and the voltage V_BLB of the complementary bit line BLB remains at the low level.

During the data flip period from the time point T2' to a time point T3' while the voltage levels of the bit lines BL and BLB change, the control signal generation circuit 170 generates the first and second control signals LAPG and LANG in the activated state and the third control signal WAP in the deactivated state. During the data flip period from the time point T2' to a time point T3', the first power supply circuit 133 is disabled in response to the first control signal LAPG in the activated state, the second power supply circuit 134 is enabled in response to the second control signal LANG in the activated state, and the switching circuit 135 is turned on in response to the third control signal WAP in the deactivated state. Accordingly, the first power supply circuit 133 is connected with the second power supply circuit 134 by the switching circuit 135. As a result, the voltage V_LA of the common node LA of the P-type sense amplifier 131, which receives the power supply voltage VDD, is higher than the voltage V_LAB of the common node LAB of the N-type sense amplifier 132, which receives the ground voltage VSS, by a threshold voltage VT of the switching circuit, 135, i.e., the transistor MP4.

Meanwhile, since the first power supply circuit 133 is disabled, the driving intensity of the P-type sense amplifier 131 is reduced, so that the I/O driver 160 can perform the write operation at high speed. Since the first power supply circuit 133 is turned off, short current is also prevented from occurring between the first power supply circuit 133 and the second power supply circuit 134. In addition, since the control signal generation circuit 170 generates the second control signal LANG in the activated state during the data flip period from the time point T2' to a time point T3', the common node LA of the P-type sense amplifier 131 and the common node LAB of the N-type sense amplifier 132 are prevented from floating.

As illustrated in FIG. 8, while the column selection signal CSL is being activated, the first control signal LAPG in the activated state and the third control signal WAP in the deactivated state may be generated during the data flip period from the time point T2' to a time point T3'. At T4, the column selection signal CSL falls. At T5, the first control signal LAPG rises and the second control signal LANG falls.

Figure 9:
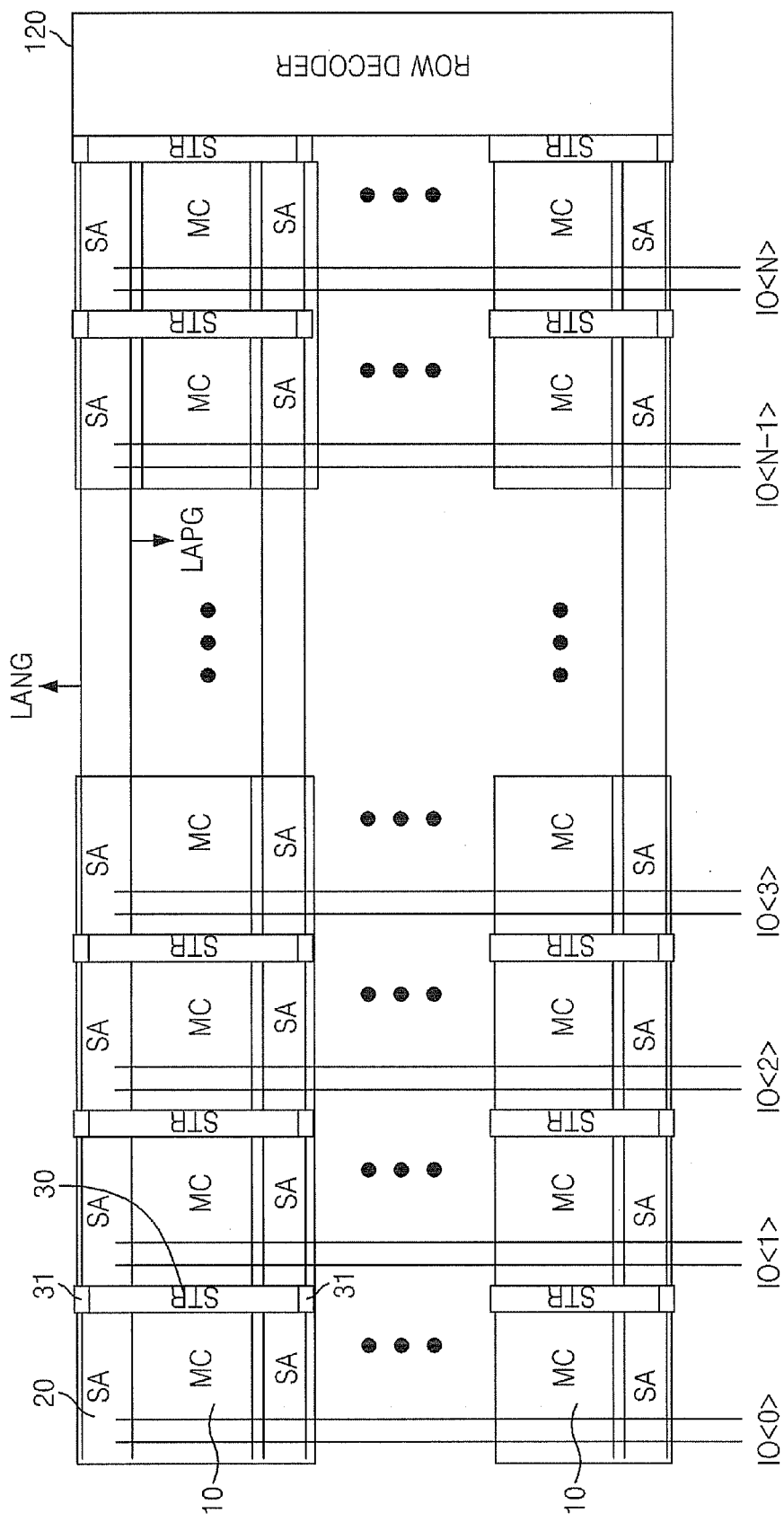
FIG. 9 is a diagram of a core of a semiconductor memory apparatus including the semiconductor device illustrated in FIG. 1 according to at least one example embodiment.

FIG. 9 is a diagram of a core of a semiconductor memory apparatus including the semiconductor device 100 illustrated in FIG. 1. Referring to FIG. 9, the semiconductor device 100, especially, a DRAM core structure includes a memory cell array area, a sense amplifier area 20, and a strap area 30.

The memory cell array area includes a plurality of memory cells 10 and a plurality of bit lines transmitting data stored in the memory cells 10. The sense amplifier area 20 includes a plurality of sense amplifiers SA which sense and amplify data of the bit lines, an I/O lines IO<N:1>, and the control signal generation circuit 170 for driving the sense amplifiers SA. The strap area 30 includes a plurality of metal contacts electrically connected to the memory cells 10. The switching circuit 135 of the semiconductor device 100 is disposed in an empty space 31 of the strap area 30, so that the area of the DRAM core does not increase.

Figure 10:
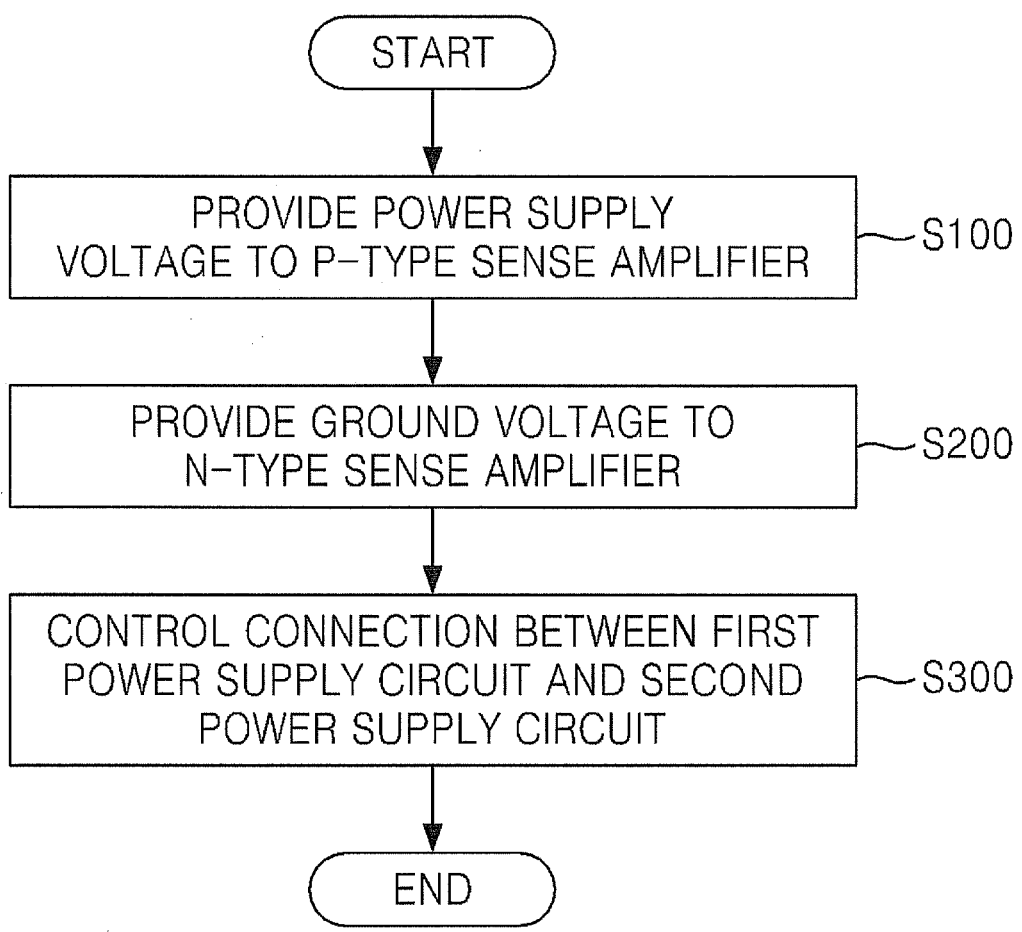
FIG. 10 is a flowchart of an operating method of the semiconductor device illustrated in FIG. 1 according to at least one example embodiment.

FIG. 10 is a flowchart of an operating method of the semiconductor device 100 illustrated in FIG. 1. Referring to FIGS. 2, 8, and 10, the first power supply circuit 133 provides the power supply voltage VDD to the P-type sense amplifier 131 connected between the bit line BL and the complementary bit line BLB in response to the first control signal LAPG in operation S100. The second power supply circuit 134 provides the ground voltage VSS to the N-type sense amplifier 132 connected between the bit line BL and the complementary bit line BLB in response to the second control signal LANG in operation S200. The switching circuit 135 controls the connection between the first power supply circuit 133 and the second power supply circuit 134 in response to the third control signal WAP in operation S300.

During the data flip period from the time point T2' to a time point T3', when the first power supply circuit 133 is turned off in response to the first control signal LAPG at the high level, the switching circuit 135 is turned on in response to the third control signal WAP at the low level. When the switching circuit 135 is implemented by the PMOS transistor MP4, the voltage V_LA of the common node LA of the P-type sense amplifier 131 receiving the power supply voltage VDD during the data flip period from the time point T2' to a time point T3' becomes higher than the voltage V_LAB of the common node LAB of the N-type sense amplifier 132 receiving the ground voltage VSS by the threshold voltage VT of the PMOS transistor MP4. Accordingly, the driving intensity of the P-type sense amplifier 131 is reduced during the data flip period from the time point T2' to a time point T3', so that the write speed of the semiconductor device 100 is increased.

Figure 11:
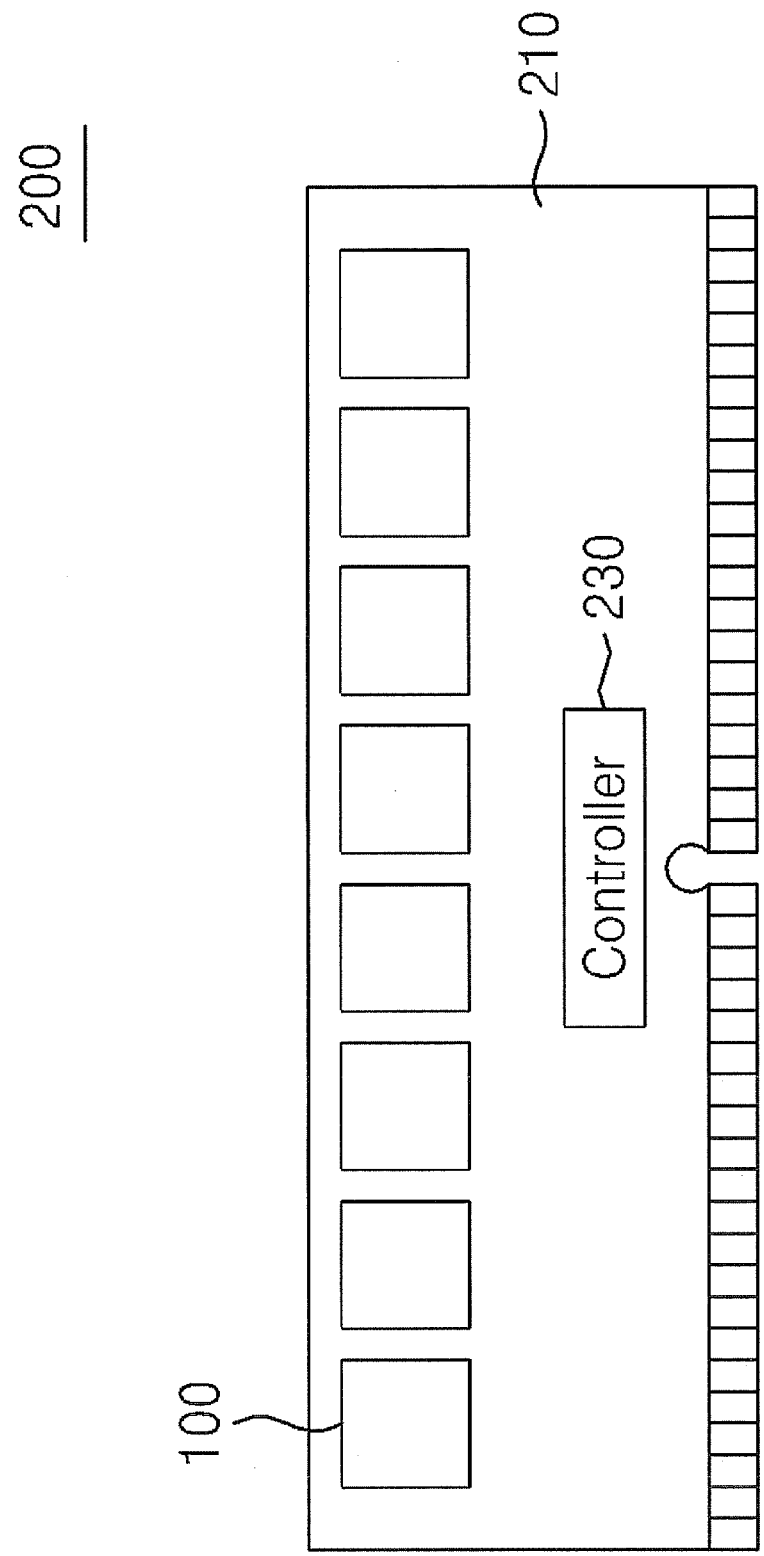
FIG. 11 is a block diagram of a memory module including the semiconductor device illustrated in FIG. 1 according to at least one example embodiment.

FIG. 11 is a block diagram of a memory module 200 including the semiconductor device 100 illustrated in FIG. 1. Referring to FIG. 11, the memory module 200 includes a semiconductor substrate 210 and a plurality of semiconductor devices 100 mounted on the semiconductor substrate 210. The structure and the operations of the semiconductor devices 100 are substantially the same as those of the semiconductor device 100 described with reference to FIGS. 1 through 9.

The memory module 200 may also include a controller 230 controlling the operations of the semiconductor devices 100. The memory module 200 may be implemented by a single in-line memory module (SIMM) or a dual in-line memory module (DIMM).

Figure 12:
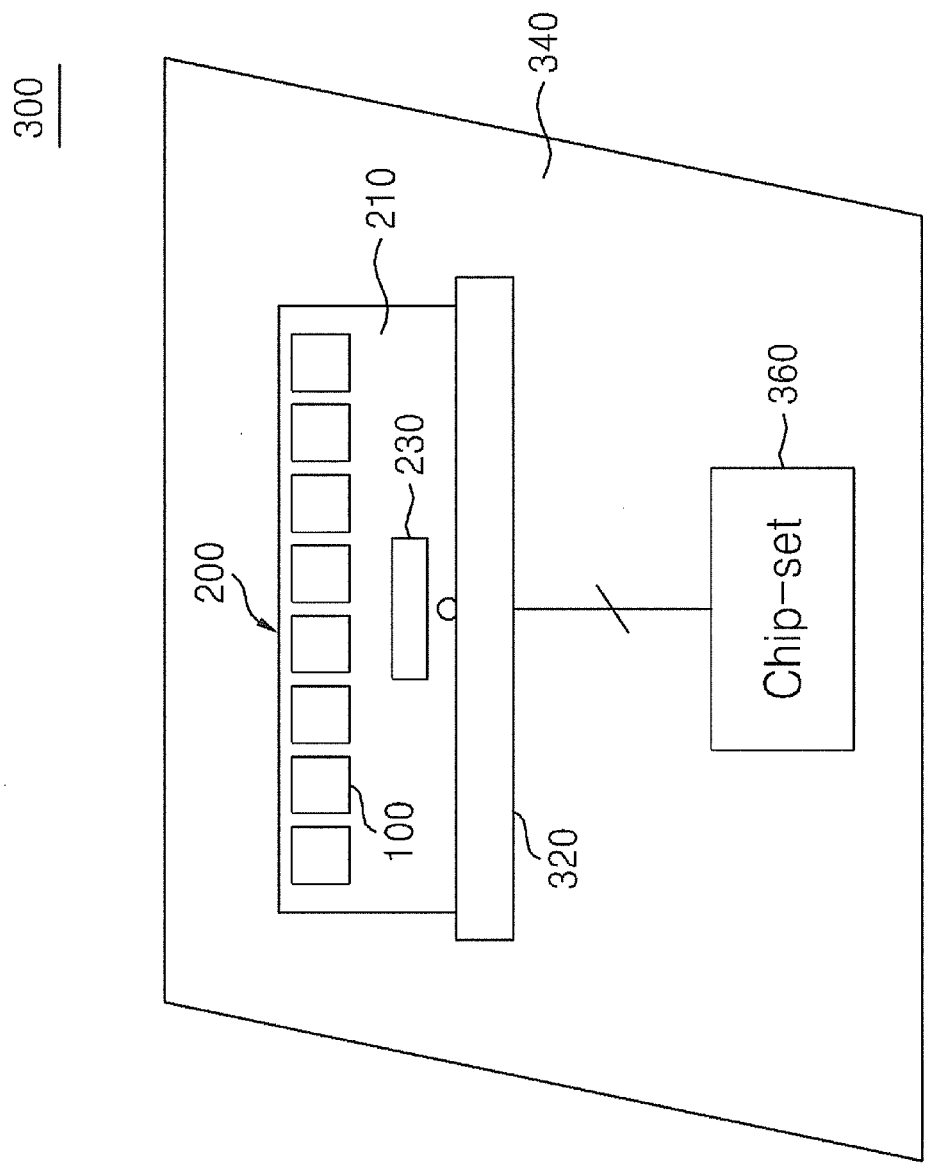
FIG. 12 is a block diagram of a memory system including the memory module illustrated in FIG. 11 according to at least one example embodiment.

FIG. 12 is a block diagram of a memory system 300 including the memory module 200 illustrated in FIG. 11. The memory system 300 may be implemented as a personal computer (PC), a tablet PC, or a mobile computing device. The memory system 300 includes a main board 340, a slot 320 mounted on the main board 340, the memory module 200 inserted into the slot 320, and a processor, e.g., a chip-set 360, which controls the operations of the semiconductor devices 100 included in the memory module 200 through the slot 320. The chip-set 360 may send data to or receive data from the semiconductor devices 100 through a data bus and the slot 320.

Figure 13:
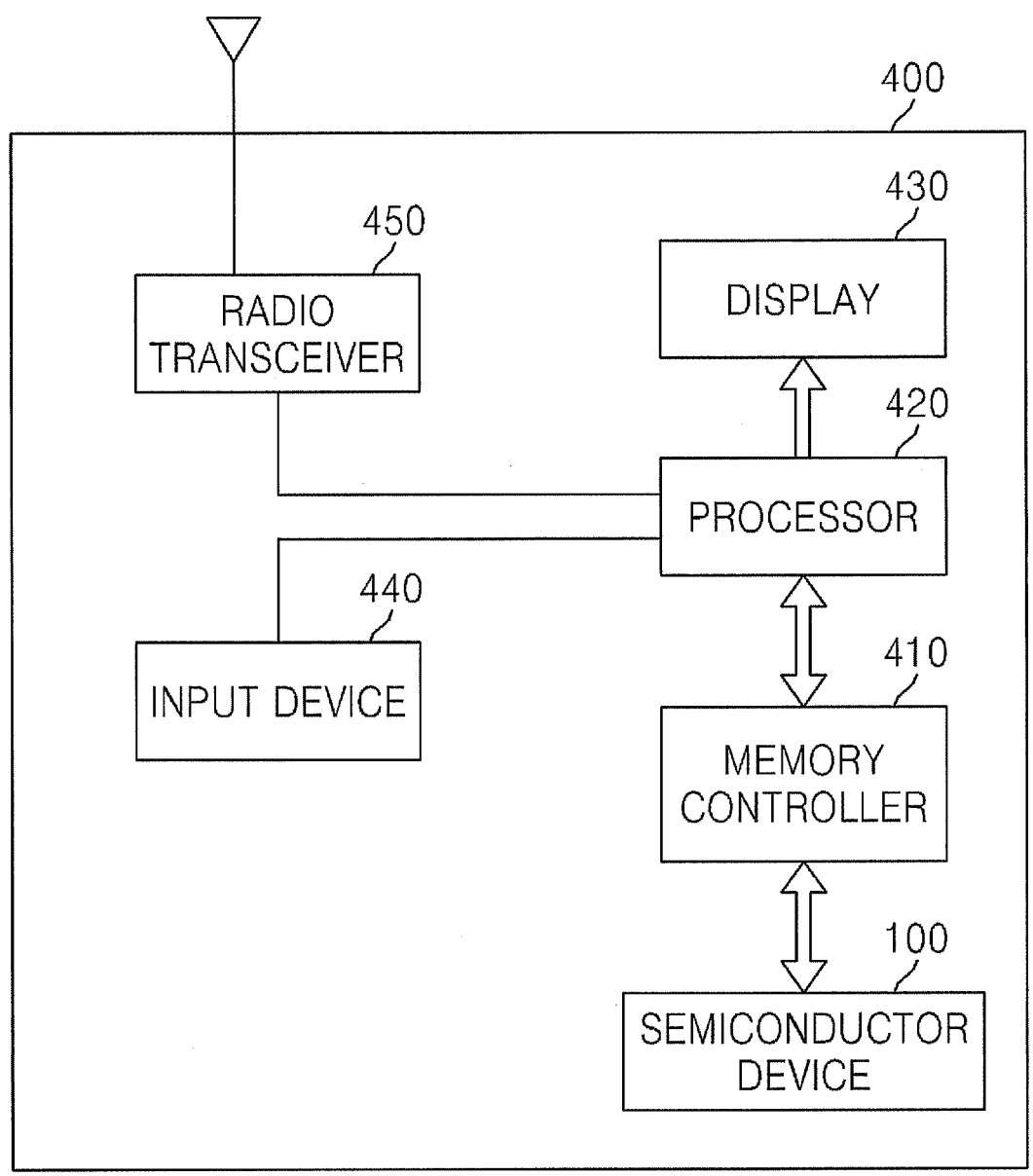
FIG. 13 is a block diagram of a memory system including the semiconductor device illustrated in FIG. 1, according to at least some embodiments.

FIG. 13 is a block diagram of a memory system 400 including the semiconductor device 100 illustrated in FIG. 1, according to some example embodiments. Referring to FIG. 13, the memory system 400 may be implemented as a cellular phone, a smart phone, a tablet PC, or a wireless Internet device. The memory system 400 includes the semiconductor device 100, a processor 420 controlling the data processing operation of the semiconductor device 100, and a memory controller 410 controlling the data access operations, e.g., a write operation and a read operation, to the semiconductor device 100 in compliance with the processor 420.

Data stored in the semiconductor device 100 may be controlled by the processor 420 or the memory controller 410 to be displayed through a display 430. A radio transceiver 450 may transmit or receive a radio signal through an antenna. The radio transceiver 450 may also convert a radio signal received through the antenna into a signal that can be processed by the processor 420. Accordingly, the processor 420 may process a signal output from the radio transceiver 450 and store the processed signal in the semiconductor device 100 through the memory controller 410 or display the processed signal through the display 430. In addition, the radio transceiver 450 may convert a signal output from the processor 420 into a radio signal and output the radio signal through the antenna.

An input device 440 allows a control signal for controlling the operation of the processor 420 or data to be processed by the processor 420 to be input to the memory system 400 and may be implemented by a pointing device such as a touch pad or a computer mouse, keypad, or keyboard. The processor 420 may control the operation of the display 430 to display data output from the semiconductor device 100, data output from the radio transceiver 450, or data output from the I/O device 440.

Figure 14:
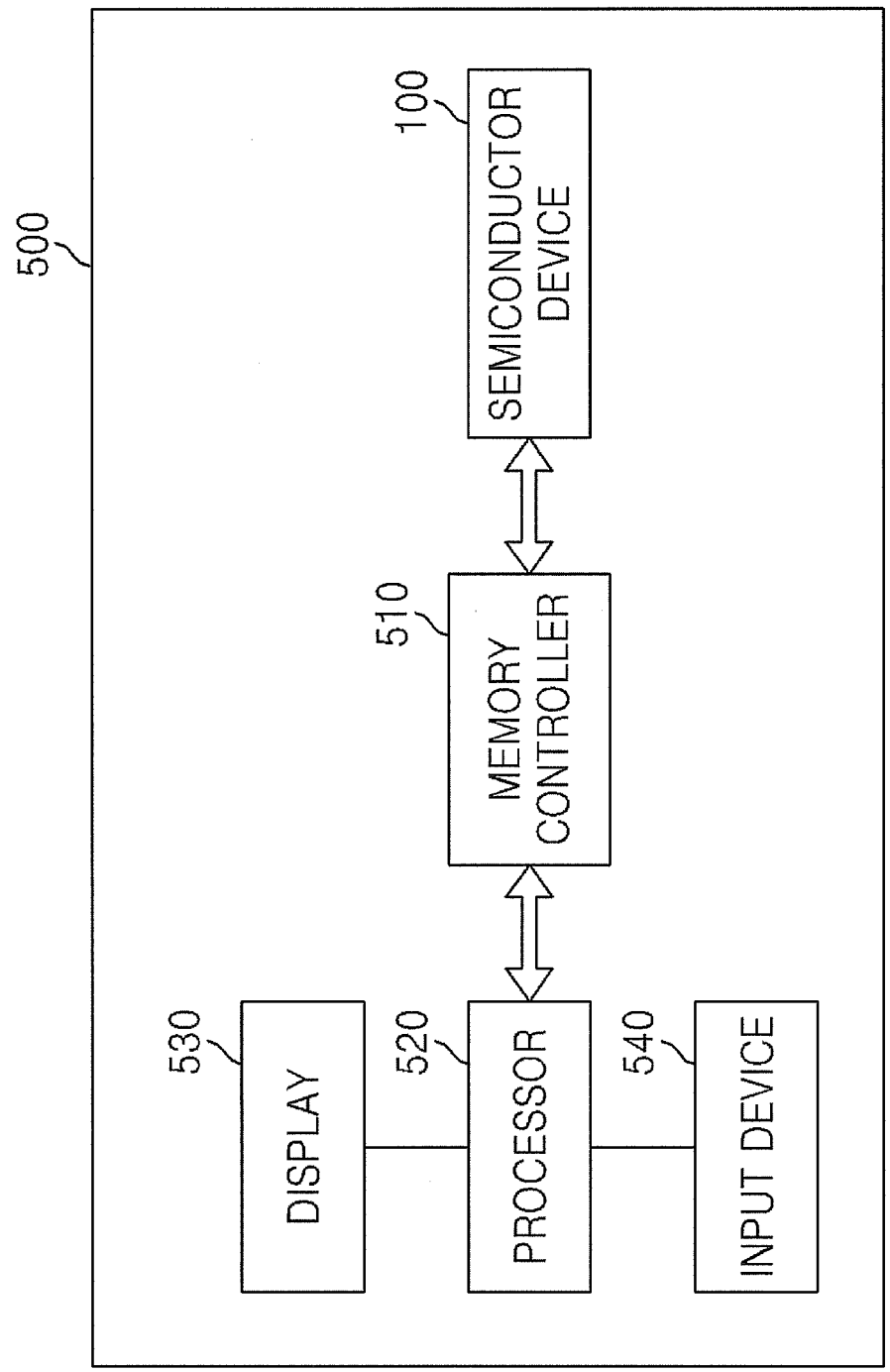
FIG. 14 is a block diagram of a memory system including the semiconductor device illustrated in FIG. 1, according to at least other example embodiments.

FIG. 14 is a block diagram of a memory system 500 including the semiconductor device 100 illustrated in FIG. 1, according to other example embodiments. Referring to FIG. 14, the memory system 500 may be implemented as a data processing device such as a table PC, a net-book, an e-reader, a personal digital assistant (PDA), a portable multimedia player (PMP), an MP3 player, or an MP4 player. The memory system 500 includes the semiconductor device 100 and a processor 520 controlling the data processing operation of the semiconductor device 100.

The processor 520 may display data stored in the semiconductor device 100 through a display 530 in response to an input signal generated by an input device 540. The memory controller 510 may control the data access to the semiconductor device 100 in compliance with the processor 520. The input device 540 may be implemented by a pointing device such as a touch pad or a computer mouse, keypad, or keyboard.

As described above, according to some example embodiments, the driving intensity of a sense amplifier is temporarily reduced during a write operation to memory cells in a semiconductor device, so that the write speed of the semiconductor device is increased.

While example embodiments have been particularly shown and described with reference to example embodiments thereof, it will be understood by those of ordinary skill in the art that various changes in forms and details may be made therein without departing from the spirit and scope of example embodiments as defined by the following claims.

What is claimed is:

1. A semiconductor device comprising:
    a first sense amplifier selectively connected between a first bit line and a second bit line;
    a second sense amplifier selectively connected between the first bit line and the second bit line;
    a first power supply circuit configured to provide a power supply voltage to the first sense amplifier in response to a first control signal;
    a second power supply circuit configured to provide a ground voltage to the second sense amplifier in response to a second control signal;
    a switching circuit configured to selectively connect the first power supply circuit and the second power supply circuit in response to a third control signal; and
    a control signal generation circuit configured to generate the first control signal and the third control signal, the first control signal and the third control signal being complementary to each other during a data flip period.

2. The semiconductor device of claim 1, wherein, during the data flip period, the switching circuit is configured to be activated in response to the third control signal if the first power supply circuit is deactivated in response to the first control signal, the switching circuit being configured to connect the first power supply circuit and the second power supply circuit if activated.

3. The semiconductor device of claim 1, wherein the first control signal and the third control signal are complementary to each other while a column selection signal is in an activated state during a write operation, the column selection signal for controlling operations of a plurality of switches which are configured to connect the first bit line and the second bit line to an input/output line and a complementary input/output line, respectively.

4. A memory module comprising:
the semiconductor device of claim 1; and
a semiconductor substrate, the semiconductor device being on the semiconductor substrate.

5. The memory module of claim 4, wherein, during a data flip period, the switching circuit is configured to be activated in response to the third control signal if the first power supply circuit is deactivated in response to the first control signal, the switching circuit being configured to connect the first power supply circuit and the second power supply circuit if activated.

6. The memory module of claim 4, wherein,
the switching circuit includes a transistor, and
a voltage of a node of the first sense amplifier is higher than a voltage of a node of the second sense amplifier by a threshold voltage of the transistor during a data flip period, the node of the first sense amplifier is configured to receive the power supply voltage, and the node of the second sense amplifier is configured to receive the ground voltage.

7. A memory system comprising:
the memory module of claim 4; and
a main board including,
 a slot configured to receive the memory module; and
 a processor configured to control an operation of the semiconductor device.

8. The memory system of claim 7, wherein, during the data flip period, the switching circuit is configured to be activated in response to the third control signal if the first power supply circuit is deactivated in response to the first control signal, the switching circuit being configured to connect the first power supply circuit and the second power supply circuit if activated.

9. The memory system of claim 7, wherein,
the switching circuit includes a transistor, and
a voltage of a node of the first sense amplifier is higher than a voltage of a node of the second sense amplifier by a threshold voltage of the transistor during the data flip period, the node of the first sense amplifier is configured to receive the power supply voltage, and the node of the second sense amplifier is configured to receive the ground voltage.

10. A memory system comprising:
the semiconductor device of claim 1; and
a memory controller configured to control an operation of the semiconductor device.

11. An operating method of a semiconductor device, the operating method comprising:
selectively providing a power supply voltage to a first sense amplifier selectively connected between a first bit line and a second bit line using a first power supply circuit which operates in response to a first control signal;
selectively providing a ground voltage to a second sense amplifier selectively connected between the first bit line and the second bit line using a second power supply circuit which operates in response to a second control signal;
controlling a connection between the first power supply circuit and the second power supply circuit using a switching circuit which operates in response to a third control signal; and
generating the first control signal and the third control signal during a data flip period, the first control signal and the third control signal being complementary to each other.

12. The operating method of claim 11, further comprising:
activating, during the data flip period, the switching circuit to connect the first power supply circuit and the second power supply circuit in response to the third control signal if the first power supply circuit is deactivated in response to the first control signal.

13. A semiconductor device comprising:
a control signal generation circuit configured to generate at least one control signal, the control signal generation circuit including first, second and third control signal generators, the first, second and third control signal generators configured to provide first, second and third control signals, respectively; and
at least one sense amplifier including first and second power supply circuits and configured to selectively connect the first and second power supply circuits based on the at least one control signal,
 the first power supply circuit configured to provide a power supply voltage based on the first control signal,
 the second power supply circuit configured to provide a ground voltage based on the second control signal, and
 the at least one sense amplifier configured to selectively connect the first and second power supply circuits based on the third control signal, wherein
  the first control signal generator is configured to provide the first control signal based on block information, a sense amplifier enable signal and a write flip signal, the write flip signal indicating an activated first control signal and a deactivated third control signal during a data flip period,
  the second control signal generator is configured to provide the second control signal based on the block information and the sense amplifier enable signal, and
  the third control signal generator is configured to provide the third control signal based on the write flip signal, the write enable signal and command execution mode information, the command execution mode information indicates a read or write command.

14. The semiconductor device of claim 13, wherein the first power supply circuit is configured to be deactivated based on the command execution mode information.

15. The semiconductor device of claim 13, wherein the at least one sense amplifier includes a switching circuit configured to receive the third control signal.

* * * * *